(12) United States Patent
Chang et al.

(10) Patent No.: US 10,615,198 B1
(45) Date of Patent: Apr. 7, 2020

(54) ISOLATION STRUCTURES IN FILM-BASED IMAGE SENSORS

(71) Applicant: APPLE INC., Cupertino, CA (US)

(72) Inventors: Yu-Hua Chang, Newark, CA (US);
Zachary M Beiley, Oakland, CA (US);
Richard W Snow, San Mateo, CA (US); Robin W Cheung, Cupertino, CA (US)

(73) Assignee: APPLE INC., Cupertino, CA (US)

( * ) Notice: Subject to any disclaimer, the term of this patent is extended or adjusted under 35 U.S.C. 154(b) by 0 days.

(21) Appl. No.: 16/231,515

(22) Filed: Dec. 23, 2018

Related U.S. Application Data

(60) Provisional application No. 62/615,979, filed on Jan. 11, 2018.

(51) Int. Cl.
*H01L 27/146* (2006.01)
*H01L 31/0352* (2006.01)

(52) U.S. Cl.
CPC .. *H01L 27/14603* (2013.01); *H01L 27/14623* (2013.01); *H01L 27/14636* (2013.01); *H01L 27/14685* (2013.01); *H01L 31/035209* (2013.01)

(58) Field of Classification Search
CPC ........ H01L 27/14603; H01L 27/14623; H01L 27/14636; H01L 27/14685; H01L 31/035209
See application file for complete search history.

(56) References Cited

U.S. PATENT DOCUMENTS

| | | | |
|---|---|---|---|
| 5,543,354 A | 8/1996 | Richard et al. | |
| 8,501,510 B2 | 8/2013 | Chao et al. | |
| 8,558,286 B2 | 10/2013 | Tian et al. | |
| 8,947,566 B2 * | 2/2015 | Kobayashi | H01L 27/14632 257/292 |
| 2009/0103037 A1 * | 4/2009 | Abe | H05K 3/361 349/150 |
| 2011/0212567 A1 * | 9/2011 | Tsai | H01L 27/14636 438/70 |
| 2013/0020468 A1 * | 1/2013 | Mitsuhashi | H01L 27/14627 250/208.1 |
| 2016/0043144 A1 * | 2/2016 | Sato | H01L 27/14601 438/59 |

* cited by examiner

*Primary Examiner* — Christine A Enad
(74) *Attorney, Agent, or Firm* — Kligler & Associates Patent Attorneys Ltd

(57) ABSTRACT

A method for fabricating an optoelectronic device includes forming an isolation structure between an array of pixel electrodes and a built-in pad (BIP) on a dielectric layer of an integrated circuit, depositing a photosensitive film over the dielectric layer, such that at least one pinch point is formed in the photosensitive film at an edge of the isolation structure. The method further includes depositing an electrode layer, which is at least partially transparent, over the photosensitive film, etching away the photosensitive film from the BIP, and after etching away the photosensitive film, depositing a metal layer over the BIP and in contact with the electrode layer.

20 Claims, 11 Drawing Sheets

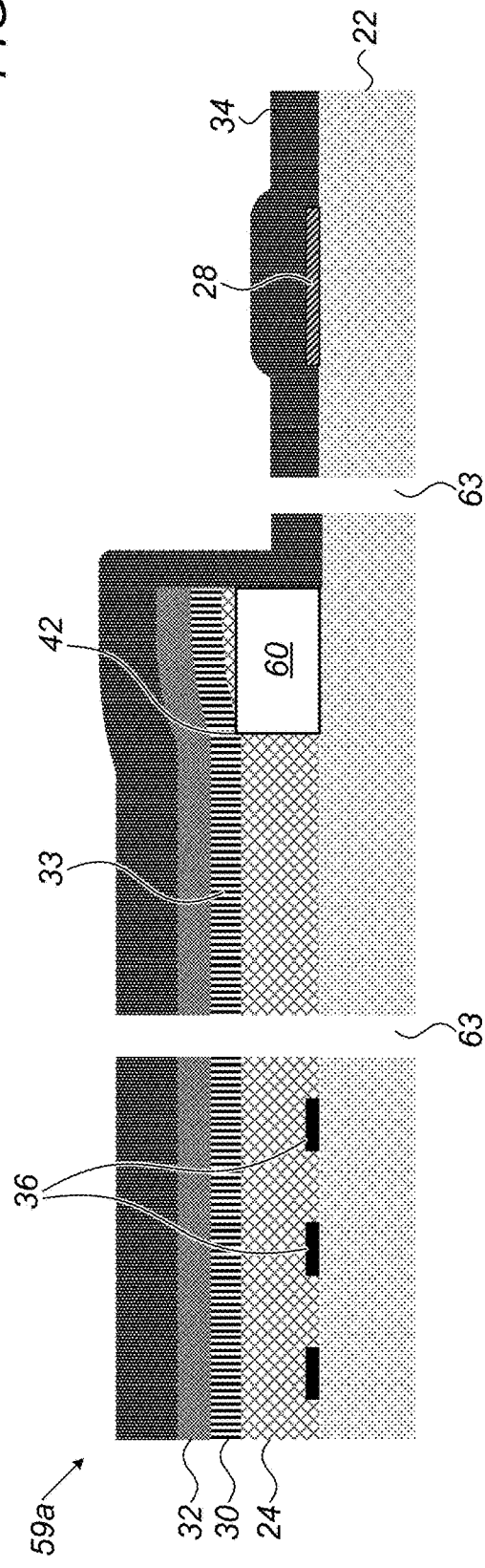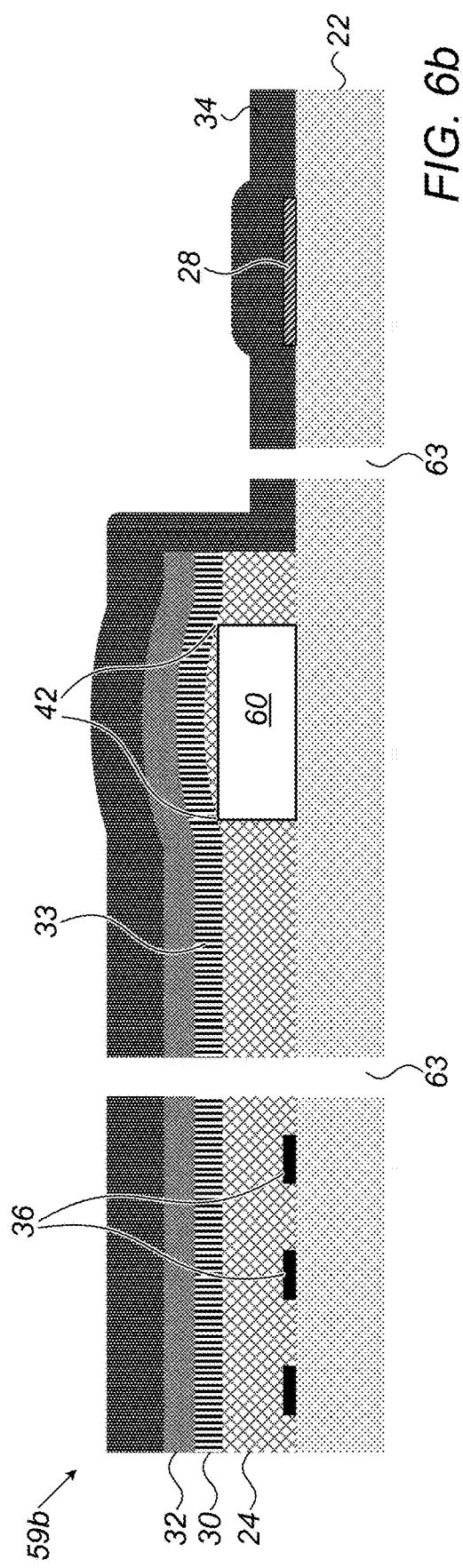

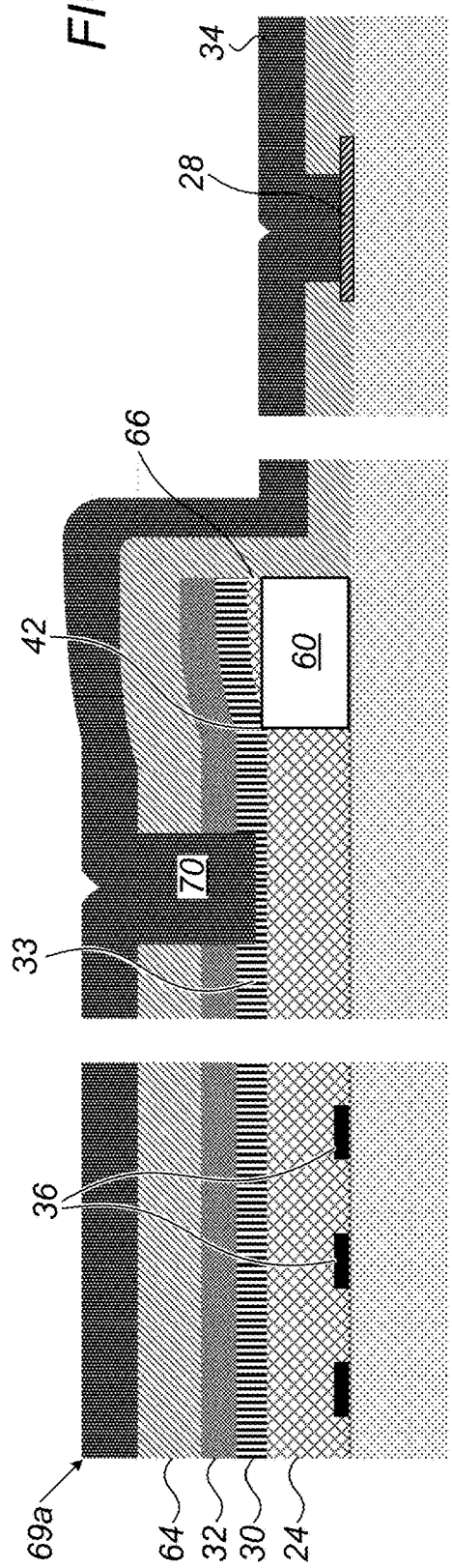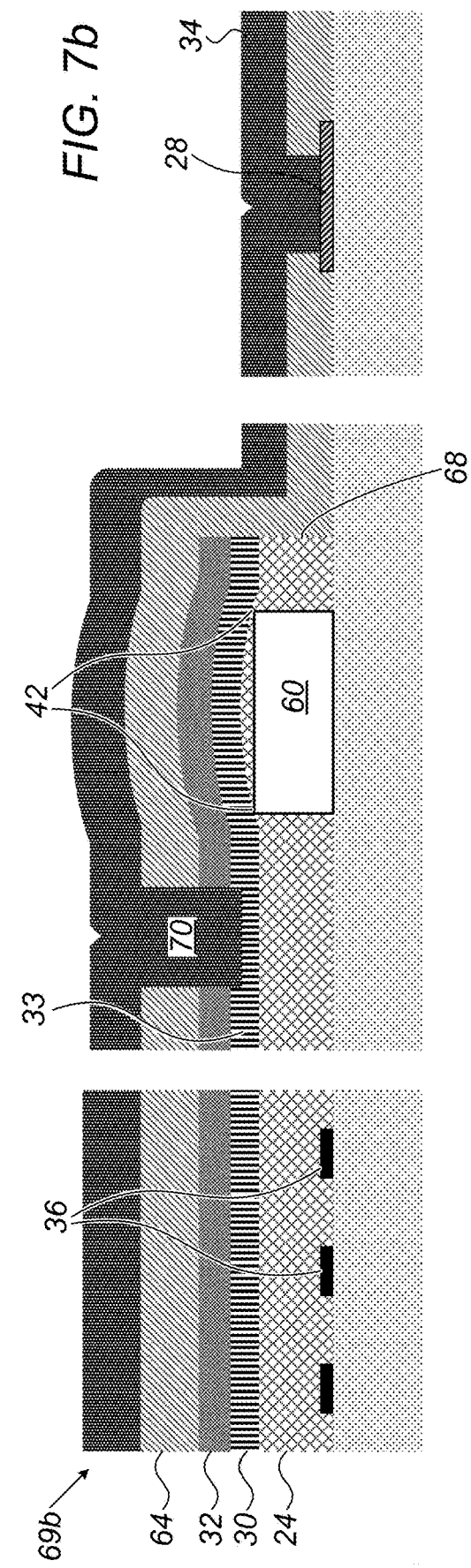

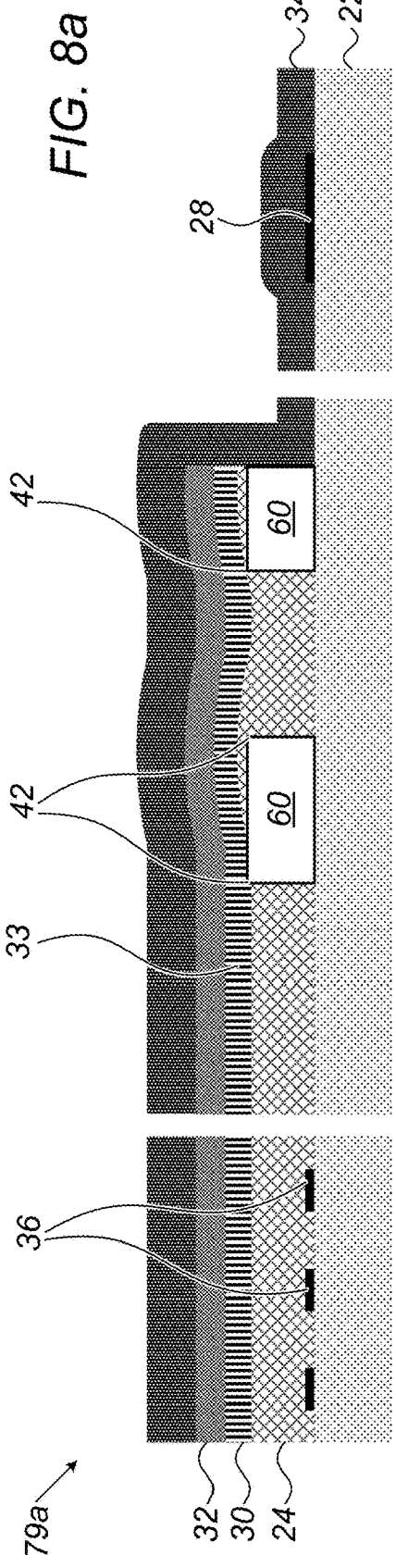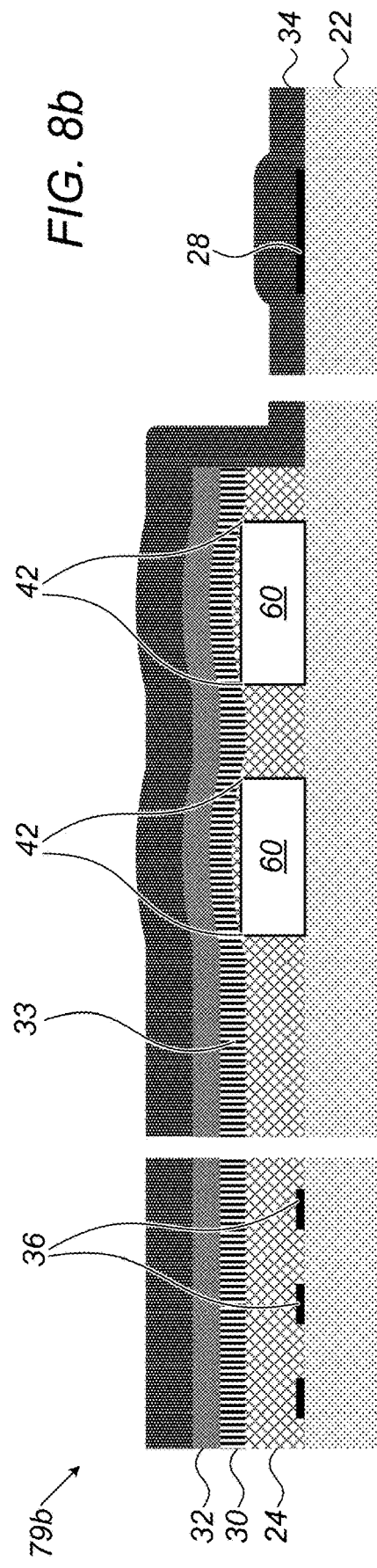

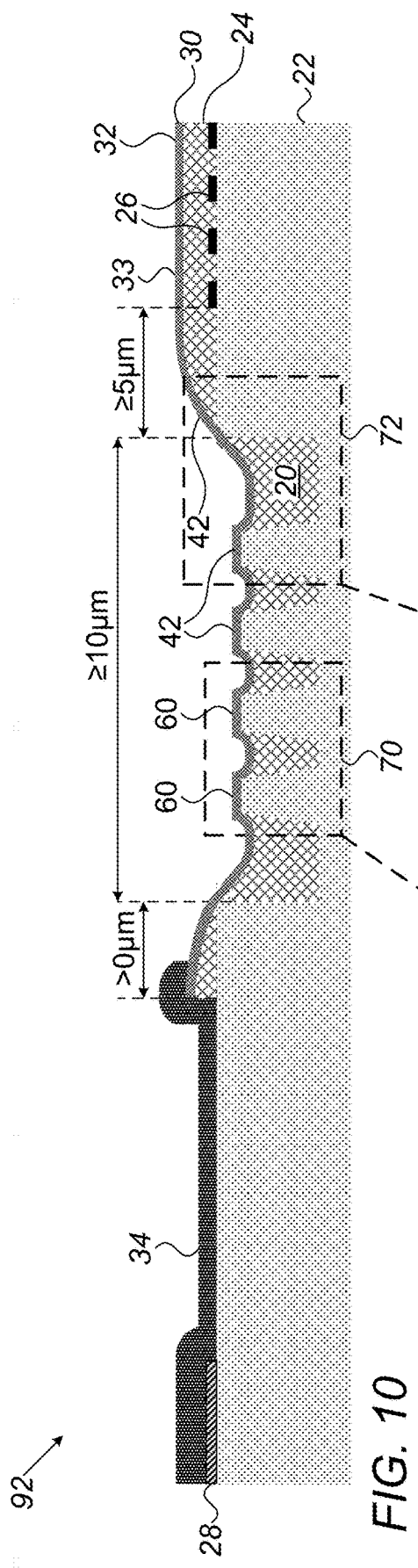
FIG. 10
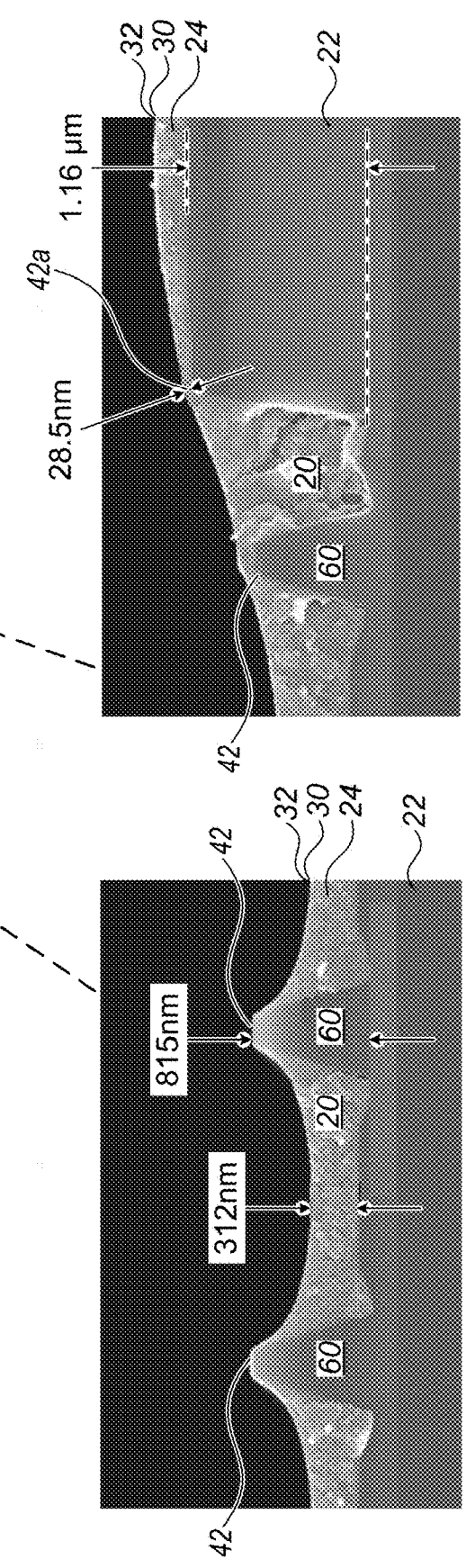
FIG. 11b
FIG. 11a

ISOLATION STRUCTURES IN FILM-BASED IMAGE SENSORS

CROSS-REFERENCE TO RELATED APPLICATION

This application claims the benefit of U.S. Provisional Patent Application U.S. 62/615,979, filed Jan. 11, 2018, which is incorporated herein by reference.

FIELD OF THE INVENTION

The present invention relates generally to optoelectronic devices, and particularly to fabrication of image sensors based on photosensitive films.

BACKGROUND

In film-based image sensors, a silicon-based readout integrated circuit (ROIC) is overlaid with a photosensitive film, such as a film containing a dispersion of quantum dots (referred to herein as a "quantum film"). The ROIC comprises a switching array, which can be similar to those used in complementary metal-oxide semiconductor (CMOS) image sensors that are known in the art. The switching array includes an array of pixel electrodes, which contact the film in order to read out the photocharge that accumulates in each pixel of the film due to incident light. A common electrode, which is at least partially transparent, is formed over the photosensitive film.

A metallization layer contacts the common electrode in order to apply a bias potential across the film. The metallization layer, which is typically opaque, covers a part of the common electrode and the underlying film, and may optionally cover one or more of the pixels in order to provide an optically-black level for purposes of black-level correction. The edge of the film and overlying common electrode are typically etched away from the ROIC before deposition of the metallization layer in order to enable the metallization layer to contact a built-in pad (BIP), through which the bias potential can then be applied to the metallization layer.

SUMMARY

Embodiments of the present invention that are described hereinbelow provide improved image sensors and methods for their manufacture.

There is therefore provided, in accordance with an embodiment of the present invention, a method for fabricating an optoelectronic device, including forming an isolation structure between an array of pixel electrodes and a built-in pad (BIP) on a dielectric layer of an integrated circuit, and depositing a photosensitive film over the dielectric layer, such that at least one pinch point is formed in the photosensitive film at an edge of the isolation structure. The method further includes depositing an electrode layer, which is at least partially transparent, over the photosensitive film, etching away the photosensitive film from the BIP, and after etching away the photosensitive film, depositing a metal layer over the BIP and in contact with the electrode layer.

In an embodiment, the method includes selecting the isolation structure from a group of structures consisting of trenches, pillars and ridges. In a further embodiment, the isolation structure includes at least one pillar formed inside a trench.

In another embodiment, the pillars and ridges include a dielectric material selected from a group of materials consisting of polyimide, silicon nitride (SiN), and silicon dioxide ($SiO_2$).

In yet another embodiment, the isolation structure includes a plurality of pillars formed alongside one another.

In a further embodiment, the isolation structure includes a trench, and the photosensitive film is etched away at a location within the trench. In another embodiment, the isolation structure includes a trench, and the photosensitive film is etched away at a location between the trench and the BIP.

In an embodiment, the isolation structure is formed on two or more sides of the array of pixel electrodes.

In a further embodiment, the photosensitive film includes a quantum film (QF).

In another embodiment, the metal layer includes aluminum.

In an embodiment, the method includes depositing at least one insulating layer over the photosensitive film and before depositing the metal layer. In another embodiment, the at least one isolation layer encapsulates the electrode layer, and the method includes etching a via through the at least one isolation layer so as to enable the metal layer to contact the electrode layer through the via. In a further embodiment, the at least one isolation layer includes SiN.

In yet another embodiment, etching away the photosensitive film includes etching the insulating layer and the electrode layer so as to expose a sidewall of the electrode layer, which is contacted by the metal layer.

In a further embodiment, the metal layer is deposited over one or more of the pixel electrodes so as to define optically-black pixels.

There is also provided, in accordance with an embodiment of the present invention, an optoelectronic device, including an integrated circuit substrate, a dielectric layer overlying the substrate, an array of pixel electrodes and a built-in pad (BIP), both disposed on the dielectric layer, an isolation structure disposed between the array of pixel electrodes and the BIP, and a photosensitive film deposited over the dielectric layer covering the array of pixel electrodes but not the BIP, and having a thickness selected such that there is at least one pinch point in the photosensitive film at an edge of the isolation structure. There is further provided an electrode layer, which is at least partially transparent, disposed over the photosensitive film, and a metal layer, which is disposed over the BIP and in contact with the electrode layer.

The present invention will be more fully understood from the following detailed description of the embodiments thereof, taken together with the drawings in which:

BRIEF DESCRIPTION OF THE DRAWINGS

FIGS. 6a and 6b are schematic sectional illustrations of image sensors, in accordance with embodiments of the invention;

FIGS. 7a and 7b are schematic sectional illustrations of image sensors, in accordance with further embodiments of the invention;

FIGS. 8a and 8b are schematic sectional illustrations of image sensors, in accordance with additional embodiments of the invention;

FIG. 10 is a schematic sectional illustration of an image sensor, in accordance with an embodiment of the invention;

FIGS. 11a and 11b are SEM micrographs of sections of FIG. 10, in accordance with an embodiment of the invention;

DETAILED DESCRIPTION OF EMBODIMENTS

Overview

As noted earlier, in the process of fabricating film-based optoelectronic devices, such as image sensors based on quantum films, the edge of the film and overlying common electrode are etched away from the ROIC before deposition of the metallization layer in order to enable the metallization layer to contact a built-in pad (BIP), through which the bias potential can then be applied to the metallization layer. The process of etching away the edge of the photosensitive film, followed by deposition of the metal layer, can cause defects to penetrate into the film and degrade image sensing performance.

Embodiments of the present invention address this problem by introducing isolation structures, such as trenches, pillars and/or ridges, in the integrated circuit between the edges of the pixel array and the BIP. When the photosensitive film is deposited over the integrated circuit, these isolation structures give rise to "pinch points" in the film, i.e., discontinuities where the film is either fully broken or at least substantial thinned. Consequently, when the film is etched away from the BIP, the discontinuities in the film prevent defects from penetrating into the portion of the film overlying the pixel array.

System Description

Figure 13:
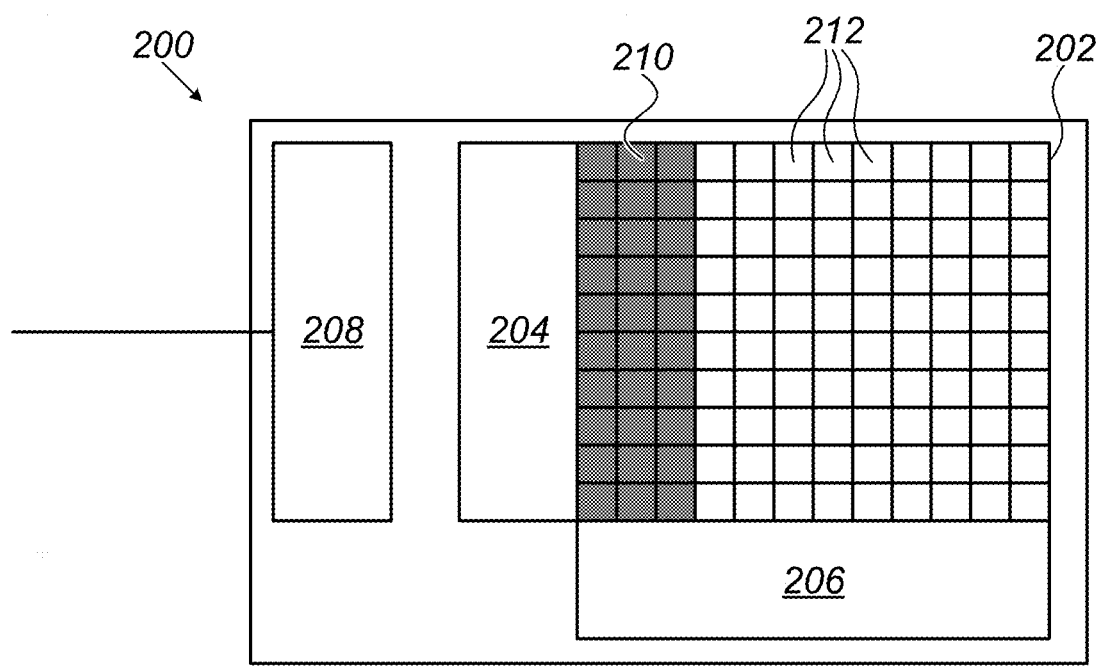
FIG. 13 is a schematic top view of an example image sensor, in accordance with an embodiment of the invention.

FIGS. 1a-1d are schematic sectional illustrations of image sensors 21a, 21b, 21c and 21d, respectively, showing the use of a trench 20 to isolate a part of a quantum film (QF) 24 on the image sensors, in accordance with embodiments of the invention. A generalized overview of an image sensor of this sort is shown in FIG. 13 and described hereinbelow with reference thereto. The parts of image sensors that are shown in the other figures that follow can also be used in the sort of generalized image sensor that is shown in FIG. 13.

Trench 20 is etched into a layer of an inter-metal dielectric (IMD) 22 (comprising, for example, $SiO_2$) on an integrated circuit substrate 23, for example a silicon wafer. Trench 20 isolates the part of quantum film (QF) 24 that is formed over an active array of pixel electrodes 26, at the right of the figures, from the part of the QF that is etched away to expose a BIP 28, at the left of the figures. The described components of the embodiments are a part of an integrated circuit; however, for the sake of simplicity, the rest of the integrated circuit is not shown in FIGS. 1-11. When QF 24 is deposited over pixel array 26 to the appropriate depth, it fills trench 20 but leaves pinch points 42 at the edges of the trench where the QF is very thin or broken entirely. A common electrode 33, comprising layers of ITO (indium tin oxide) and SiN (silicon nitride), for example, is deposited over QF 24, followed by a layer of aluminum 34, which connects BIP 28 to ITO 30.

Figure 1A:
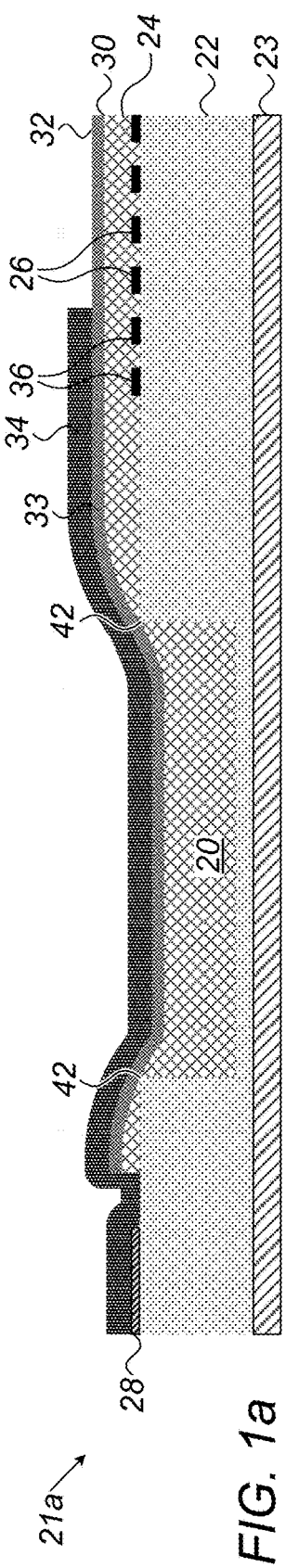
FIGS. 1a-1d are schematic sectional illustrations of image sensors, in accordance with an embodiment of the invention.
Figure 1B:
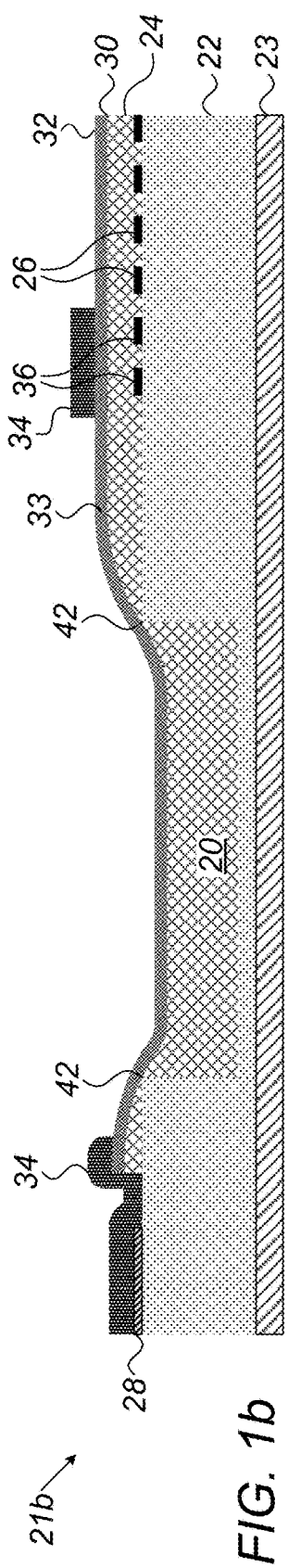
Figure 1C:
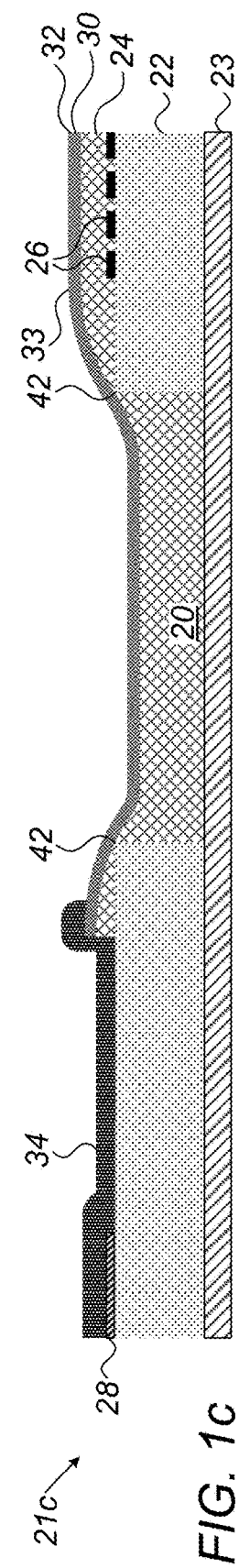
Figure 1D:
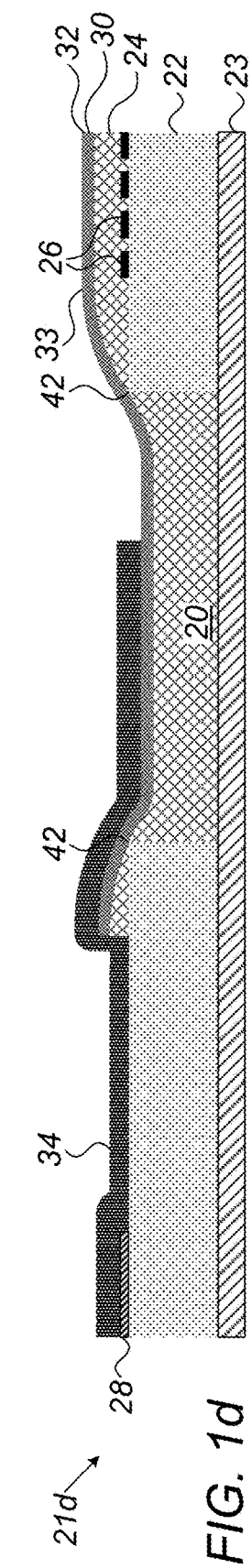

FIGS. 1a-1d show four different options for patterning of aluminum 34. In FIGS. 1a-1b, opaque aluminum 34 also covers optically-black pixels 36, used for dark current calibration, for example, at the edge of array 26, with a continuous aluminum layer in FIG. 1a and a discontinuous aluminum layer in FIG. 1b. In FIGS. 1c-1d, aluminum 34 stops short of array 26, with the aluminum stopping before trench 20 in FIG. 1c and inside the trench in FIG. 1d, and does not cover any of pixels 26.

The labels of FIGS. 1a-1d are used in the subsequent figures for identical or similar features.

Figure 2:
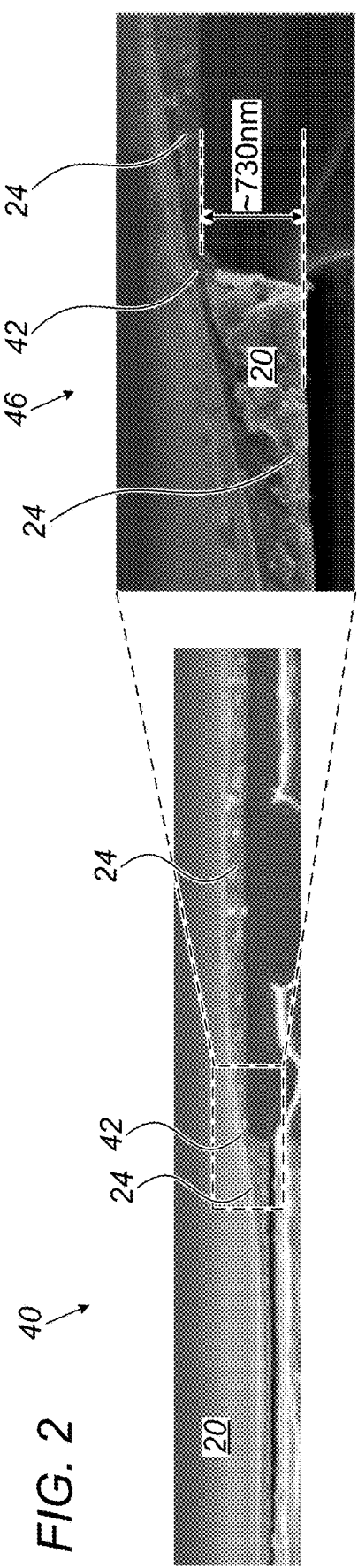
FIG. 2 is a SEM micrograph of an area around a pinch point in a quantum film at the edge of a trench, in accordance with an embodiment of the invention.

FIG. 2 is a SEM micrograph 40 of an area around pinch point 42 at the edge of trench 20, in accordance with an embodiment of the invention. The area around pinch point 42 is shown in greater detail in a zoomed-in portion 46 of micrograph 40. A depth of 730 µm of trench 20 in the disclosed embodiment is marked in zoomed-in portion 46.

Figure 3:
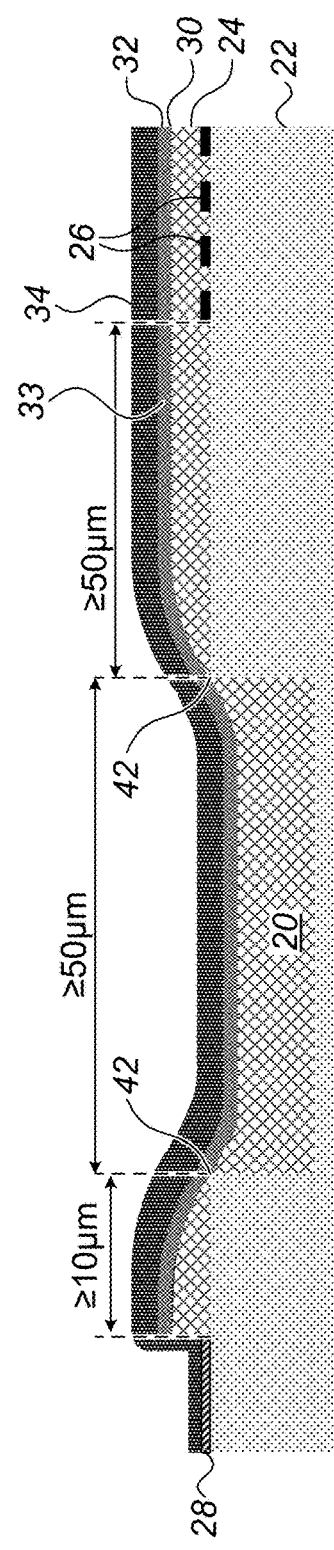
FIG. 3 is a sectional illustration showing characteristic dimensions of a trench and bordering areas of an inter-metal dielectric (IMD) layer in an image sensor, in accordance with an embodiment of the invention.

FIG. 3 is a sectional illustration showing characteristic dimensions of trench 20 and bordering areas of IMD 22, in accordance with an embodiment of the invention. QF 24 is a very low-viscosity material (<1 centipoise), which facilitates the sort of coating that is described herein and causes pinch points 42 to form without significantly disrupting the QF thickness and uniformity far (>10 µm) from the edge of trench 20 (or ridge 44 as shown in FIG. 2). Wettability (due to the surface preparation and surface energy of the substrate and surface tension of QF 24) can also facilitate the desired pinch-off of the QF. For higher-viscosity solutions, it may be advantageous to increase the lateral distances and/or decrease the heights of the trenches or ridges.

In the pictured embodiment, the width of trench 20 is at least 50 µm, the distance of array 26 from the trench is also at least 50 µm, and the distance of BIP 28 from the trench is at least 10 µm.

Figure 4A:
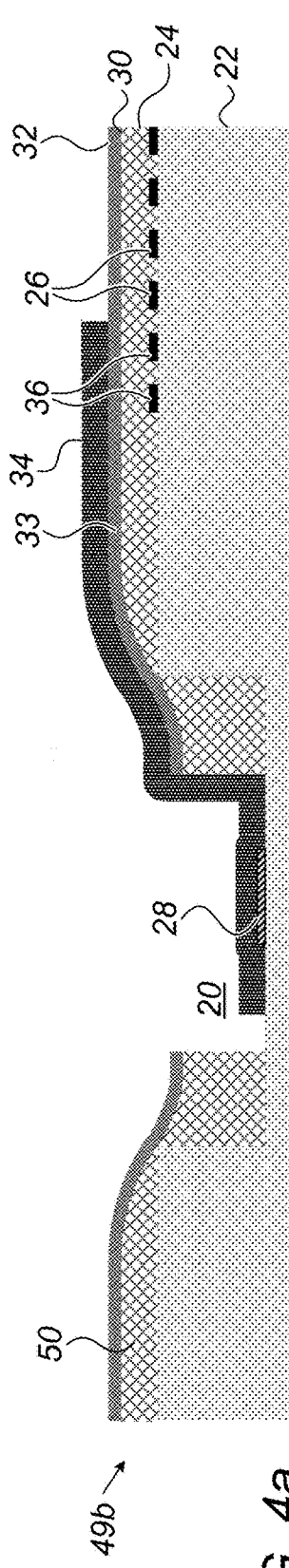
FIGS. 4a-4c are schematic sectional illustrations of image sensors, in accordance with further embodiments of the invention.
Figure 4B:
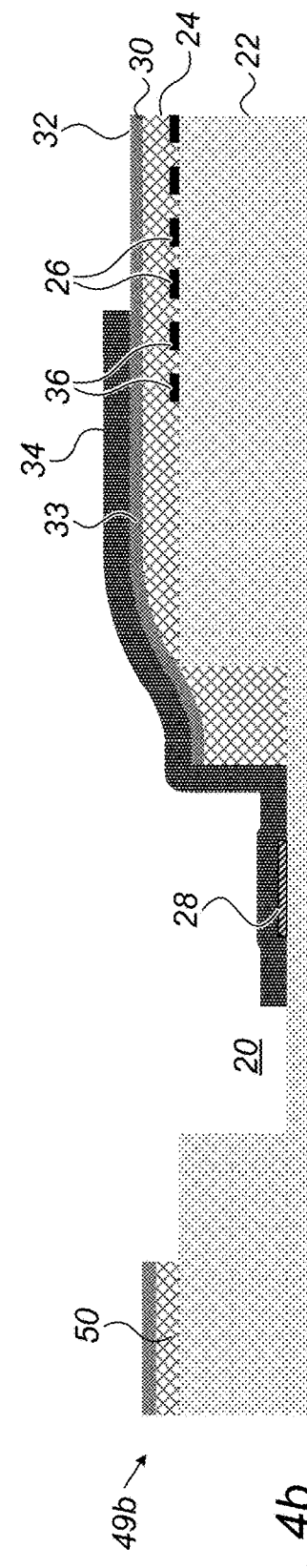
Figure 4C:
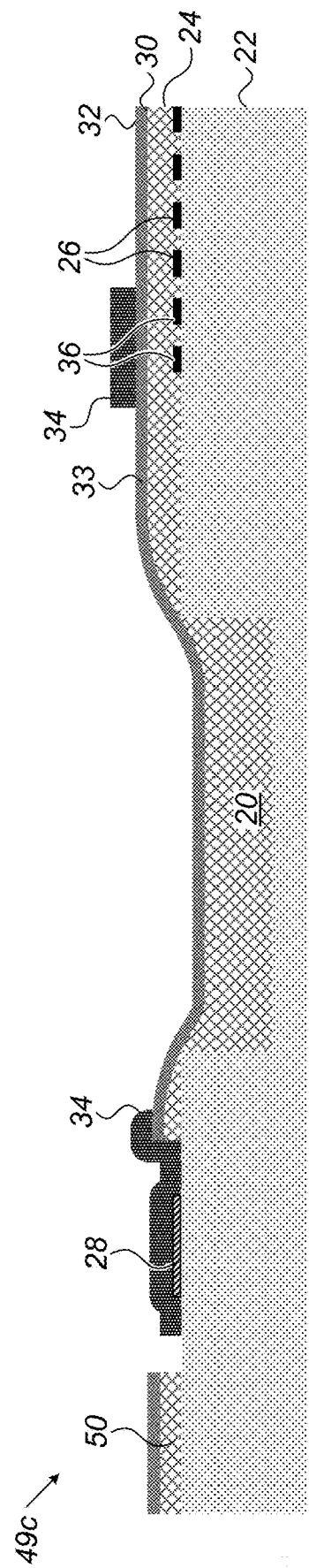

FIGS. 4a-4c are schematic sectional illustrations of image sensors 49a, 49b and 49c, respectively, showing the use of trench 20 to isolate a part of QF 24, in accordance with further embodiments of the invention.

In these embodiments, the part of QF 24 that is deposited over pixel array 26 is isolated from the area that is etched away to expose BIP 28. Furthermore, an additional area 50 of QF 24 is left outside pixel array 26, on the opposite side of trench 20, to serve as an anti-reflection area (taking advantage of the strong absorption of light by the QF). Anti-reflective area 50 of QF 24 starts inside trench 20 in FIG. 4a, whereas in FIG. 4b it starts outside the trench. In FIGS. 4a-4b, BIP 28 is formed inside trench 20, whereas in FIG. 4c the BIP is on the far side of the trench from pixel array 26. Furthermore, in FIGS. 4a-4b the aluminum cover of optically-black pixels 36 is a contiguous part of aluminum 34, whereas in FIG. 4c the aluminum layer is discontinuous.

FIG. 4c can be seen as an extension of FIG. 1b, showing anti-reflective area 50 to the left of BIP 28.

Figure 5A:
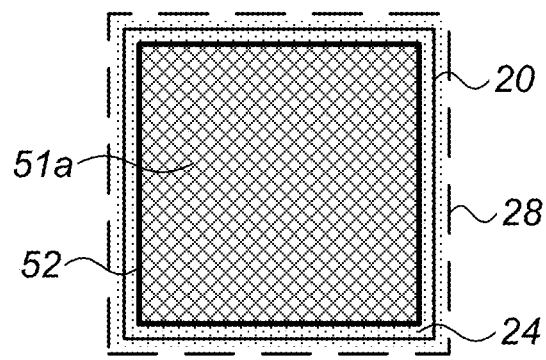
FIGS. 5a-5c are schematic top views of pixel arrays, illustrating the location of trenches around the outer borders of the pixel arrays, in accordance with embodiments of the invention.
Figure 5B:
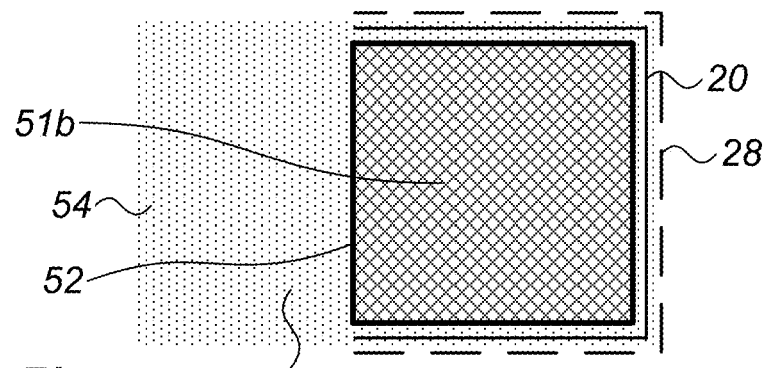
Figure 5C:
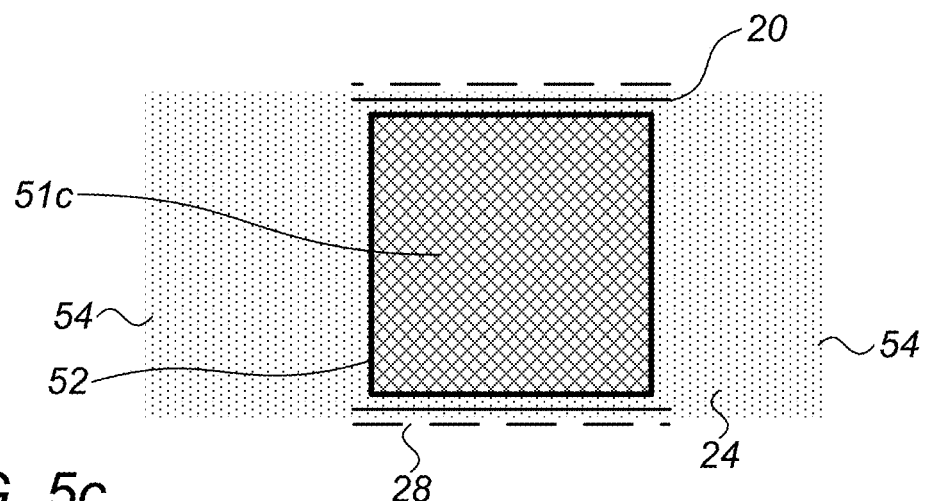

FIGS. 5a-5c are schematic top views of pixel arrays 51a, 51b and 51c, respectively, illustrating the location of trenches 20 around outer borders 52 of the pixel arrays, in accordance with embodiments of the invention. These pixel arrays form a part of an image sensor, such as the image sensor that is shown in FIG. 13 and described with reference thereto hereinbelow.

In FIG. 5a, trench 20, as well as BIP 28, completely surrounds array 51a on its four sides. Alternatively, BIP 28 may extend partially on one side of the array, or on two or three sides of the array.

In FIG. 5b, trench 20, as well as BIP 28, surrounds array 51b on three sides, whereas in FIG. 5c both the trench and the BIP surround array 51c on two sides. In each of the disclosed embodiments, BIP 28 may extend partially on fewer sides of the array.

In a further embodiment, trench 20 may extend on only one side of the pixel array, in order to accommodate restrictions on the overall layout of the integrated circuit.

Typically, when trench 20 is not formed around all four sides of the pixel array, as in FIGS. 5b-5c, QF 24 extends farther away from the array, thus reducing the likelihood that defects will penetrate back to the array from a far edge 54 of the QF.

FIGS. 6a and 6b are schematic sectional illustrations of image sensors 59a and 59b, respectively, showing the use of a pillar 60 to isolate a part of QF 24, in accordance with embodiments of the invention.

Pillar 60 is formed on IMD 22 to isolate the part of a QF 24 that is formed over the active array of pixel electrodes (at the left side, not shown in these figures) from the part of the QF that is etched away to expose BIP 28, at the right of the figures. Pillar 60 typically comprises a dielectric material, such as polyimide, SiN, or $SiO_2$. (Pillar 60 is typically elongated in the direction perpendicular to the page and thus has the form of a ridge, as illustrated in FIG. 8. The terms "pillar" and "ridge" are used interchangeably in the present description to mean a structure that protrudes above the underlying substrate.) QF 24 is deposited over IMD 22, typically to a depth that is less than the height of pillar 60 (so that the QF is pinched off at the edge of the pillar, which thus protects the sidewall of the QF). PD 24 is overlaid by common electrode 33 (fabricated by atomic layer deposition (ALD) and ITO, for example) and then an insulating layer of SiN 32. Vertical breaks 63 in FIGS. 6a and 6b indicate that the actual horizontal dimensions are much larger than those shown in the figures.

In image sensor 59a, QF 24 and overlying layers are etched away together with the right side of pillar 60, leaving a single pinch point 42 in the QF, after which aluminum layer 34 is deposited so as to contact BIP 28 and the right edge of ITO layer 30. In image sensor 59b, QF 24 and the overlying layers are etched away slightly beyond pillar 60, giving two pinch points 42 in the QF.

FIGS. 7a and 7b are schematic sectional illustrations of image sensors 69a and 69b, respectively, showing the use of pillar 60 to isolate a part of QF 24, in accordance with further embodiments of the invention. In both of these embodiments, pillar 60 is formed, and QF 24, common electrode 33, and SiN 32 layers are deposited and then etched away at the right side, as in the corresponding embodiments in FIGS. 6a and 6b. In the embodiments of FIGS. 7a and 7b, however, an additional SiN layer 64 is then formed over the etched SiN layer 32 in order to encapsulate sidewalls 66 and 68, respectively, (at the right side) of QF 24. A via 70 is etched through the two SiN layers 32 and 64, so that when aluminum layer 34 is deposited over SiN layer 64, it fills the via and thus contacts common electrode 33 at the bottom of the via. This approach is advantageous in isolating QF 24 from contact with aluminum 34 while providing a large contact area between the aluminum and common electrode 33.

The embodiment disclosed in FIG. 7a provides one pinch point 42, whereas the embodiment disclosed in FIG. 7b provides two pinch points 42.

FIGS. 8a and 8b are schematic sectional illustrations of image sensors 79a and 79b, respectively, showing the use of two pillars 60 to isolate a part of QF 24, in accordance with additional embodiments of the invention. In these embodiments, two pillars 60 (or ridges) are formed alongside one another in order to provide greater isolation of the part of QF 24 that is deposited over the array of pixel electrodes 26, at the left of the figures, from the part of QF 24 that is etched away to expose BIP 28, at the right of the figures. These embodiments provide three and four pinch points 42, as shown in FIGS. 8a and 8b, respectively. Alternatively, other numbers of pillars 60 (or ridges), such as three, four, or more, may be provided.

Figure 9A:
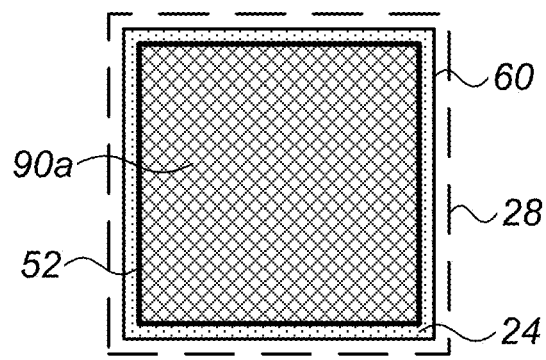
FIGS. 9a-9c are schematic top views of pixel arrays, illustrating the location of pillars formed as ridges around the outer borders of the pixel arrays, in accordance with embodiments of the invention.
Figure 9B:
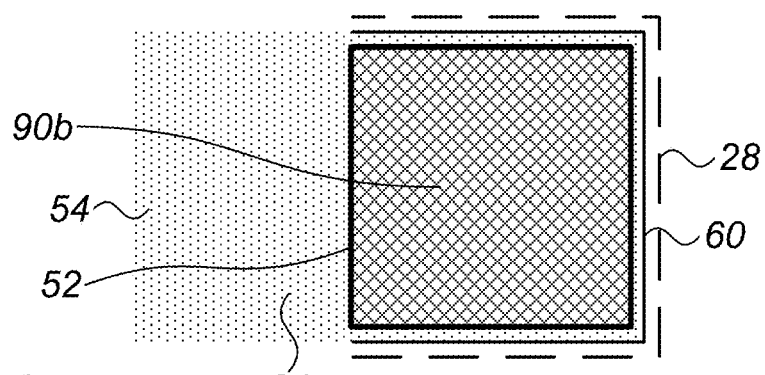
Figure 9C:
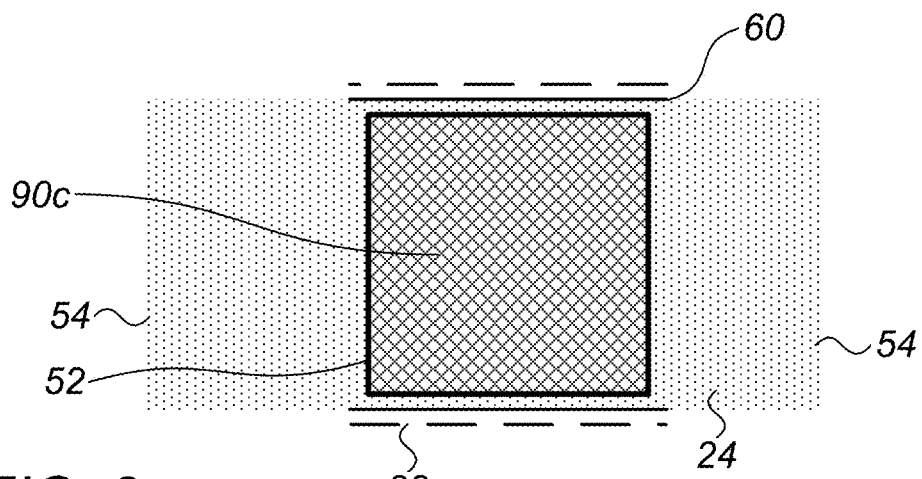

FIGS. 9a-9c are schematic top views of pixel arrays 90a, 90b and 90c, respectively, illustrating the locations of pillars formed as ridges 60 around outer borders 54 of the pixel arrays, in accordance with embodiments of the invention.

In FIG. 9a, ridge 60, as well as BIP 28, completely surround array 90a on its four sides. Alternatively, BIP 28 may extend partially on one side of the array, or on two or three sides of the array.

In FIG. 9b, ridge 60, as well as BIP 28, surround array 90b on three sides, whereas in FIG. 9c both the ridge and the BIP surround the array on two sides. In each of the disclosed embodiments, BIP 28 may extend partially on fewer sides of the pixel array.

In a further embodiment, ridge 60 may extend on only one side of the pixel array, in order to accommodate restrictions by the overall chip layout.

Typically, when ridge 60 is not formed around all four sides of the pixel array, as in FIGS. 9b-9c, QF 24 extends farther away from the array, thus reducing the likelihood that defects will penetrate back to the array from far edge 54 of the QF.

FIG. 10 is a schematic sectional illustration of an image sensor 92, showing the use of ridges 60 formed in trench 20 to isolate a part of QF 24, in accordance with an embodiment of the invention.

In this embodiment, four ridges 60 are formed in trench 20 in order to isolate the part of QF 24 that is formed over the active array of pixel electrodes 26, at the right of FIG. 10, from the part of the QF that is etched away to expose BIP 28, at the left of the figure. This embodiment combines features of the preceding embodiments and can provide even more effective isolation, with multiple pinch points 42 in QF 24. Example dimensions are marked on the drawing. Areas 70 and 72 correspond to the SEM micrographs of FIGS. 11a and 11b, respectively.

Trench 20 may surround array 26 on four, three, or two sides, as shown in FIGS. 5a-c, respectively, with ridges 60 extending continuously along the trench.

FIGS. 11a and 11b are SEM micrographs of areas 70 and 72, respectively, of FIG. 10, in accordance with an embodiment of the invention. The height of ridges 60 and the thickness of QF 24 between the ridges are marked in FIG.

11a. The depth of trench 20 and the thickness of QF 24 at pinch point 42 at the edge of the trench are marked in FIG. 11b.

Figure 12:
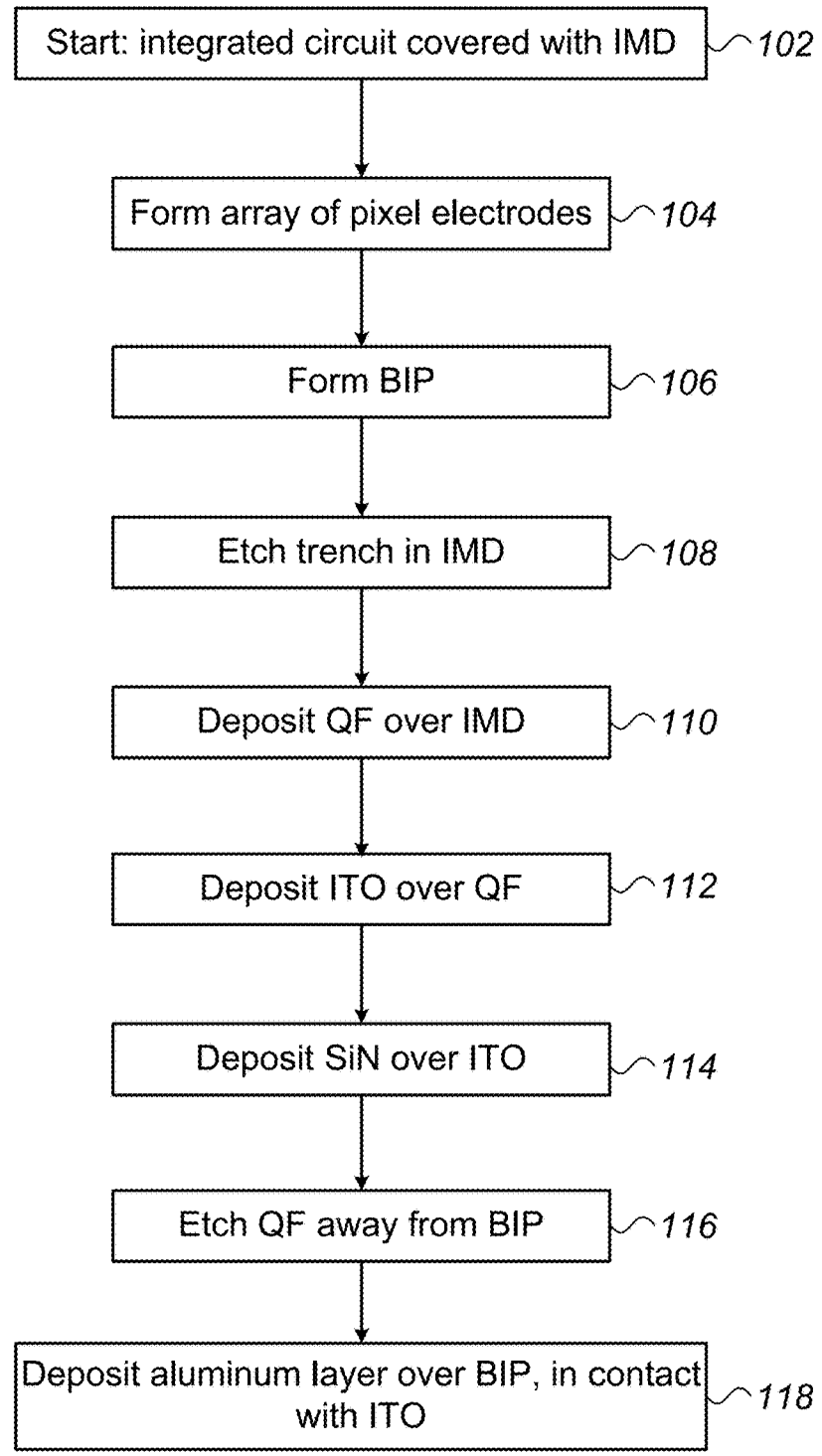
FIG. 12 is a flowchart that schematically illustrates a method for fabricating an optoelectronic device, in accordance with an embodiment of the invention.

FIG. 12 is a flowchart 100 that schematically illustrates a method for fabricating an optoelectronic device, in accordance with an embodiment of the invention. Flowchart 100 illustrates a method for fabrication of the image sensors shown in FIGS. 1a-1d. Similar methods may be used, mutatis mutandis, in fabricating optoelectronic devices in accordance with the other embodiments described above.

In a starting step 102, the fabrication of the optoelectronic device starts from an integrated circuit covered with IMD 22. In a pixel electrode formation step 104, the array of pixel electrodes 26 is formed over IMD 22, for example by depositing and then etching a suitable metal layer. BIP 28 is typically etched from the same metal layer, in a BIP formation step 106, which may be carried out concurrently with step 104. Trench 20 is etched into IMD 22, serving as an isolation structure between pixel electrodes 26 and BIP, at an isolation step 108.

In a film deposition step 110, a layer of a photosensitive film, such as QF 24, is deposited over IMD 22. As a result, at least one pinch point is formed in the photosensitive film at the edge of trench 20. In an electrode deposition step 112, a layer of transparent, conductive material, such as ITO 30, is deposited over QF 24, to serve as a common electrode. In a SiN deposition step 114, a layer of SiN may be deposited over ITO 30. In an etching step 116, QF 24 is etched away from BIP 28, thus exposing the BIP. In further metal deposition step 118, a metal contact layer, for example aluminum 34, is deposited over BIP 28, in contact with both ITO 30 and BIP 28.

Trenches 20 and ridges 60 used to isolate QF 24, as illustrated in the embodiments described above, may have any suitable dimensions, as long as they result in sufficient pinching off at the edge of the part of the QF that overlies pixel array 26. By way of example, with respect to the example embodiment of FIG. 10, the height of ridge 60 may be at least 1.2 times the thickness of QF 24, up to the depth of trench 20, and advantageously about 1.6 times the QF thickness. For some designs, the aspect ratio of each ridge 60 (i.e., the ratio of ridge height to ridge width) may be between 1 and 10, for example 1.9. The pitch of ridges 60 (i.e., the distance between each ridge and its nearest neighbor) is typically at least twice the thickness of QF 24, and may advantageously be about 4.5 times the QF thickness. In example embodiments, the depth of trench 20 is between 1.2 and 2.5 times the thickness of QF 24, and may be set, for instance, to 1.5 times the QF thickness. Outside trench 20, the thickness of QF 24 can be in a range between 10 nm and 2000 nm. In one design, the thickness of QF 24 is about 460-470 nm.

FIG. 13 shows a top view of an exemplary image sensor 200 as described herein, in which the isolation structures described above can be used. Image sensor 200 may comprise an imaging area comprising a pixel array 202, which may include a first plurality of pixels 212 that may be used to convert incident light into electrical signals. In some instances, pixel array 202 may comprise an obscured region 210 including at least one pixel (e.g., a second plurality of pixels) that is obscured relative to incoming light (e.g., covered by a light-blocking layer). Electrical signals may still be read out from some or all of these pixels, but since there is ideally no light reaching these pixels, the current measured from these pixels may represent the dark current associated with one or more components of the image sensor. Image sensor 200 (or associated processing circuitry) may compensate for the dark current levels during image capture and/or processing.

Image sensor 200 may further comprise row circuitry 204 and column circuitry 206, which collectively may be used to convey various signals (e.g., bias voltages, reset signals) to individual pixels as well as to read out signals from individual pixels. For example, row circuitry 204 may be configured to simultaneously control multiple pixels in a given row, while column circuitry 206 may convey pixel electrical signals to other circuitry for processing. Accordingly, image sensor 200 may comprise control circuitry 208, which may control the row circuitry 204 and column circuitry 206, as well as performing input/output operations (e.g., parallel or serial IO operations) for image sensor 200. The control circuitry may include a combination of analog circuits (e.g., circuits to provide bias and reference levels) and digital circuits (e.g., image enhancement circuitry, line buffers to temporarily store lines of pixel values, register banks that control global device operation and/or frame format).

Although the embodiments described above relate to image sensors of certain particular designs, the principles of the present invention may similarly be applied, mutatis mutandis, in fabrication of other sorts of film-based optoelectronic devices. Furthermore, although certain specific materials are mentioned above and marked in the figures for the sake of clarity and concreteness of description, the principles of the present invention may similarly be applied, mutatis mutandis, in using other suitable materials that are known in the art. All such alternative applications and implementations are considered to be within the scope of the present invention.

It will thus be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method for fabricating an optoelectronic device, comprising:
   forming an isolation structure between an array of pixel electrodes and a built-in pad (BIP) on a dielectric layer of an integrated circuit;
   depositing a photosensitive film over the dielectric layer, such that at least one pinch point is formed in the photosensitive film at an edge of the isolation structure;
   depositing an electrode layer, which is at least partially transparent, over the photosensitive film;
   etching away the photosensitive film from the BIP; and
   after etching away the photosensitive film, depositing a metal layer over the BIP and in contact with the electrode layer.

2. The method according to claim 1, wherein the isolation structure is selected from a group of structures consisting of trenches, pillars and ridges.

3. The method according to claim 2, wherein the isolation structure comprises at least one pillar formed inside a trench.

4. The method according to claim 2, wherein the pillars and ridges comprise a dielectric material selected from a group of materials consisting of polyimide, silicon nitride (SiN), and silicon dioxide ($SiO_2$).

5. The method according to claim 2, wherein the isolation structure comprises a plurality of pillars formed alongside one another.

6. The method according to claim 2, wherein the isolation structure comprises a trench, and the photosensitive film is etched away at a location within the trench.

7. The method according to claim 2, wherein the isolation structure comprises a trench, and the photosensitive film is etched away at a location between the trench and the BIP.

8. The method according to claim 1, wherein the isolation structure is formed on two or more sides of the array of pixel electrodes.

9. The method according to claim 1, wherein the photosensitive film comprises a quantum film (QF).

10. The method according to claim 1, wherein the metal layer comprises aluminum.

11. The method according to claim 1, and comprising depositing at least one insulating layer over the photosensitive film and before depositing the metal layer.

12. The method according to claim 11, wherein the at least one isolation layer encapsulates the electrode layer, and wherein the method comprises etching a via through the at least one isolation layer so as to enable the metal layer to contact the electrode layer through the via.

13. The method according to claim 11, wherein the at least one isolation layer comprises SiN.

14. The method according to claim 11, wherein etching away the photosensitive film comprises etching the insulating layer and the electrode layer so as to expose a sidewall of the electrode layer, which is contacted by the metal layer.

15. The method according to claim 1, wherein the metal layer is deposited over one or more of the pixel electrodes so as to define optically-black pixels.

16. An optoelectronic device, comprising:
an integrated circuit substrate;
a dielectric layer overlying the substrate;
an array of pixel electrodes and a built-in pad (BIP), both disposed on the dielectric layer;
an isolation structure disposed between the array of pixel electrodes and the BIP;
a photosensitive film deposited over the dielectric layer covering the array of pixel electrodes but not the BIP, and having a thickness selected such that there is at least one pinch point in the photosensitive film at an edge of the isolation structure;
an electrode layer, which is at least partially transparent, disposed over the photosensitive film; and
a metal layer, which is disposed over the BIP and in contact with the electrode layer.

17. The optoelectronic device according to claim 16, wherein the isolation structure is selected from a group of structures consisting of trenches, pillars and ridges.

18. The optoelectronic device according to claim 17, wherein the isolation structure comprises at least one pillar formed inside a trench.

19. The optoelectronic device according to claim 17, wherein the pillars and ridges comprise a dielectric material selected from a group of materials consisting of polyimide, silicon nitride (SiN), and silicon dioxide ($SiO_2$).

20. The optoelectronic device according to claim 17, wherein the isolation structure comprises a plurality of pillars formed alongside one another.

* * * * *